United States Patent
Dalton et al.

(10) Patent No.: US 6,613,484 B2
(45) Date of Patent: Sep. 2, 2003

(54) METHOD TO DECREASE FLUORINE CONTAMINATION IN LOW DIELECTRIC CONSTANT FILMS

(75) Inventors: Timothy J. Dalton, Ridgefield, CT (US); Bernd E. E. Kastenmeier, Beacon, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/034,859

(22) Filed: Dec. 20, 2001

(65) Prior Publication Data

US 2003/0116533 A1 Jun. 26, 2003

(51) Int. Cl.$^7$ ............................................... H01L 21/302
(52) U.S. Cl. ........................... 430/5; 438/725; 438/714; 438/696; 216/49; 216/67
(58) Field of Search ............................... 430/5; 438/725, 438/714, 696; 216/49, 67

(56) References Cited

U.S. PATENT DOCUMENTS 6,465,159 B1 * 10/2002 Ni et al. ..................... 430/314

OTHER PUBLICATIONS

"Effects fo Fluorocarbon Polymer Deposition On The Selective Etching of SiO$_2$/Photoresist In High Density Plasma"; Chu et. al.; Journal of Vacuum Science & Technology, B: microelectronics and Nanometer Structures; (12–001); pp. 2763–2768; 18(6).*

* cited by examiner

Primary Examiner—G Goudreau
(74) Attorney, Agent, or Firm—Tiffany L. Townsend

(57) ABSTRACT

A method for maintaining critical dimension during the etching of dielectrics, having the following steps:
  depositing a layer of photoresist over a layer of dielectric;
  patterning the photoresist such that voids are formed in the photoresist, the voids having sidewalls and a bottom;
  depositing an overlayer in an etch chamber;
  transferring the patterning in the photoresist to the dielectric.

16 Claims, 1 Drawing Sheet

METHOD TO DECREASE FLUORINE CONTAMINATION IN LOW DIELECTRIC CONSTANT FILMS

FIELD OF THE INVENTION

This invention is directed to a semiconductor processing and more particularly to the reducing the effects of chemically active species on susceptible dielectric materials.

BACKGROUND OF THE INVENTION

Degradation can occur in low dielectric constant materials (low k) when those low k materials come into contact with a chemically active species, such as oxygen and/or fluorine. This degradation is a serious concern because it represents a potential failure mechanism for an integrated circuit. The degradation problem is costly to the industry by virtue of process monitoring, inspections, chip yield and equipment maintenance requirements that it entails. Types of degradation problems typically occurring in low k processing are widening of the features (loss of critical dimensions), profile degradation (bowing or undercutting), and roughening of the sidewalls of the features.

The production of advanced semiconductor devices is becoming increasingly complicated by changes in dielectric materials. Lower dielectric constant materials are necessary to ensure faster speeds and greater reliability necessary for advanced semiconductor devices. During the processing of low k film stacks, a variety of films may have to be etched. For example, as shown in FIG. 1, it is necessary to etch films to form features. An opening 15, is formed in a layer of photoresist, 5, by any means known in the art, the opening, 15, has a width, w1. The photoresist layer, 5, may contain an antireflective coating (ARC) and other layers may exist between the photoresist and the substrate. For example, hardmasks such as silicon nitride or silicon dioxide may be embedded between the photoresist and the substrate. When the substrate, 10 is etched, the shape of the feature can be changed by the chemical and physical interactions of the gas phase species (such as F, fluorine, or O, oxygen) with the photoresist, hardmask and or substrate sidewalls. Typically, when the substrate, 10, is etched in an environment containing chemically active species, such as F and O, the width of the feature, 15, is increased, w2, as shown in FIG. 2. The initial width, w1, of the feature, 15, is shown with a dotted line in FIG. 2. While it is possible to create the initial width in the photoresist that attempts to anticipate the changes that can occur when etching a low k material in a fluorine containing environment, it is more advantageous to try to create an environment in the etch chamber that allows control the shape of the profile.

Fluorine contamination is also a concern in that it can affect the dielectric constant (and stress) of a low k film. For example, undoped PECVD silane oxide has a relative dielectric constant of 4.3. While a fluorine doped silane oxide film can have a lower dielectric constant, the film stress of the fluorine containing film, as quantified by a FLEXUS, increases. These factors can not often be accurately accounted for as the fluorine doping is not intentional and may not be reliably predicted. Thus, there remains a need for a method for reducing the effects of fluorine containing environment on the patterning of low k materials.

The present invention details a method by which control over profile parameters, such as undercut, sidewall bowing, corner rounding and/or critical dimensions can be achieved. The method described here need not employ additional manufacturing tooling since it can be performed in at least some families of existing tools. However, ex-situ processing is feasible also.

SUMMARY OF THE INVENTION

It is therefore an object of the present invention to provide a method for decreasing the effects of liberated chemically active species on low k materials.

It is also an object of the present invention to provide an in situ method of reducing CD loss in low k dielectrics.

These and other objectives are achieved in the present invention by providing a method for maintaining profile control during the etching of dielectrics, comprising the steps of:

depositing a layer of photoresist over a layer of dielectric;

patterning the photoresist such that voids are formed in the photoresist, the voids having sidewalls and a bottom;

depositing an overlayer in an etch chamber;

transferring the patterning in the photoresist to the dielectric.

BRIEF DESCRIPTION OF THE FIGURES

These and other features, aspects and advantages will be more readily apparent and better understood from the following detailed description of the invention, in which.

DESCRIPTION OF THE PREFERRED EMBODIMENTS

In the instant invention, it has been found that an environment containing a chemically active species is more harmful if the liberated species is available to attack the low k material during the etching step, in the etch chamber, where the low k dielectric itself is being etched. Examples of the damage that can occur are CD loss, bowing and undercut. Hereafter, fluorine will be used as a representative of chemically active species. However, this invention contemplates other chemically active species other than fluorine and the methods disclosed and claimed are applicable for other chemically active species, such as oxygen. While a number of possible solutions exist, including finding a fluorine free etching chemistry, the inventors have found that conditioning the etch chamber and the surface that is to be etched can prevent one or more of the possible damage types mentioned above.

Figure 1:
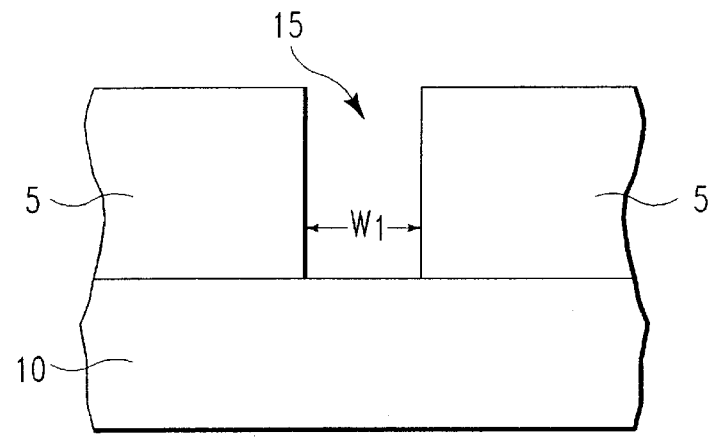
FIG. 1 is a cross section of the prior art photoresist layering
Figure 2:
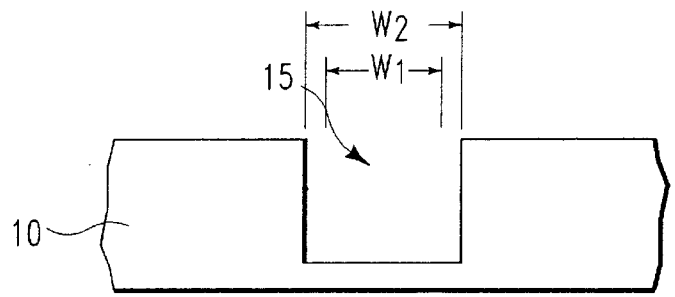
FIG. 2 is a cross section of a prior art patterned low k dielectric film
Figure 3:
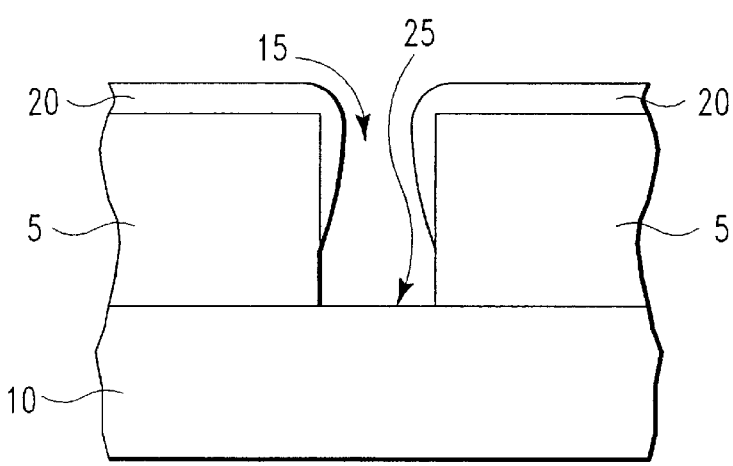
FIG. 3 is a cross section of an embodiment of the instant invention showing the deposited overlayer.

A first, preferred, embodiment of conditioning the surface is shown in FIG. 3. An overlayer is deposited once the photoresist film is patterned. The overlayer acts as a barrier to the active species from the discharge (plasma). It is thought by the inventors that the fluorine (chemically active species) is consumed by the byproducts of the overlayer removal. The overlayer should not significantly change the sizing of the feature contemplated by the initial patterning of the photoresist. The feature size should be substantially the same as it would be without the overlayer deposition step (assuming that the size of the feature would not be effected by a fluorine containing environment). This means that the critical dimensions as contemplated by the design constraints can be predictably patterned without accounting for possible unpredictable processing effects that can be caused by the presence of a fluorine containing species. Further, the chamber conditioning can decrease sidewall roughness. Sidewall roughness can cause voiding in the subsequently formed metallization.

As shown in FIG. 3, the overlayer 20, is deposited on the photoresist, 5, after the photoresist is patterned with an opening 15, having a width w1. The photoresist is usually patterned using photolithography techniques that are well known in the art. Preferably, but not necessarily, the overlayer would be selectively deposited such that there would be substantially no overlayer deposition on the exposed surface, 25, of the underlying layer, 10. The overlayer acts as a barrier to the active species from the plasma. By acting as a barrier, the overlayer can prevent loss of CD. The overlayer may also produce a surface covering the resist sidewall which is smoother than the resist prior to overlayer deposition. This may result in smoother etch profiles. Furthermore, the etch chamber will be in a different "state" during the subsequent dielectric etch process. The "state" of the etch chamber will be one depleted of chemically active species. It is thought that either the overlayer deposition of the overlayer or the etch of the overlayer, which directly precedes the etching of the dielectric layer depletes the chamber of chemically active species.

Once the overlayer was deposited the etch process would proceed. When the etch is completed the width of the feature would be substantially the same as the width of the patterned photoresist, w1. It is important to this embodiment that the feature size as etched in the substrate be predictable. By predictable it is meant that profile erosion (corner rounding, sidewall tapering) can be minimized and profile shape (bowing and undercut) reliably etched. Additionally, the method of the instant embodiment helps control sidewall roughness which can occur as a result of the etch processes.

It is of course contemplated, but not preferred, that the deposition of the overlayer could be such that the width is more narrow than the width w1. However, the focus of this invention is on reducing the adverse effects of the environment containing a chemically active species that can exist during the etching of the substrate, without substantially effecting the critical dimensions as they would have existed without the deposition of the overlayer. It is in fact a critical element of the instant embodiment that the feature as transferred into the substrate, 10, (any figure) not be significantly more narrow than the feature as patterned in the overlying substrate.

Figure 4:
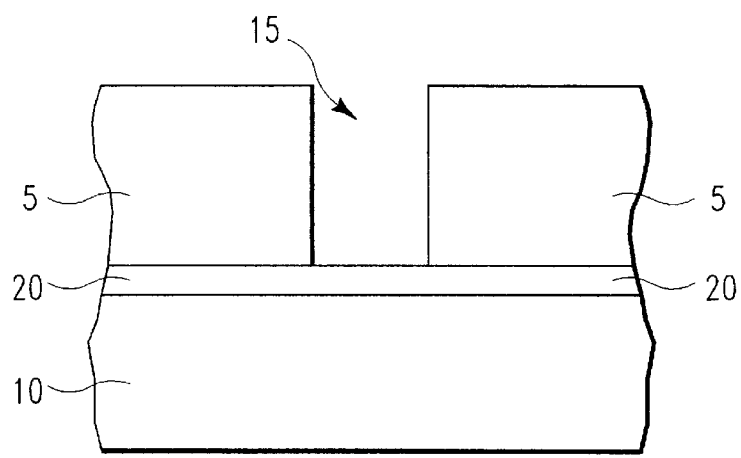
FIG. 4 is a cross section of an alternate embodiment of the instant invention showing the deposited overlayer.

It is also contemplated that the overlayer, 20, be embedded in the layers between the opening, 15, in the patterned photoresist, 5, and the substrate, 10, itself (see FIG. 4). The substrate, 10, may or may not be patterned and contain openings. If there are openings in the substrate, 10, then the overlayer will preferably fill the openings. As shown in FIG. 4, the invention contemplates alternate layerings of photoresist and overlayer. The only limitation is that the overlayer be deposited after the dielectric and etched prior to the dielectric.

The composition of the plasma is not critical to the instant invention, what is critical is that first, the deposition chemistry changes the etch chamber conditioning during the subsequent etch step such that adverse effects to the substrate are avoided and second, that the overlayer itself not affect the etching of the underlying. However, in a preferred embodiment, the plasma overlayer would comprise a polymer-like material. Examples of possible polymer chemistries include hydrocarbons of the form [(CH2)n], fluorocarbon polymers of the form [(CF2)n] and mixed hydrofluorocarbons of the form [(CHxFy)n]. A polymerizing chemistry results in a reduction of chemically active species. Also preferably, the plasma would be non-oxidizing and scavenge the detrimental chemically active species present. The thickness of the overlayer needs to be at least about several angstroms. The overlayer should cover substantially all photoresist present but would not necessarily cover the exposed surface at the bottom of the patterned feature. In a preferred embodiment, the overlayer would cover at least about ⅓ of the length of the sidewalls of the patterned feature. In a more preferred embodiment the overlayer would cover at most about ⅔ of the length of the sidewalls (as measured from the top surface).

Preferably, the thickness of the overlayer would be at least about 10 nm and at most about 100 nm, but is not limited to that range. It is contemplated that the overlayer could be several microns. The only upper limit to the thickness of the overlayer contemplated by the inventors is a thickness at which delamination of the overlayer would occur. Delamination would occur when the stress in the polymer layer increases to the point where the film starts to lift off.

In summary, the embodiments outlined above provide a method for reducing the effects liberated chemical species have on critical dimension line/via pattern transferrance in dielectrics, specifically low k dielectrics.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed:

1. A method for maintaining profile control during the etching of dielectrics, comprising the steps of:
   a. depositing a layer of photoresist over a layer of dielectric, the dielectric having a dielectric constant of at most about 4.3;
   b. patterning the photoresist such that voids are formed in the photoresist, the voids having sidewalls and a bottom;
   c. depositing an non-oxidizing overlayer in an etch chamber, the overlayer capable of depleting the etch chamber of chemically active species;
   d. transferring the patterning in the photoresist to the dielectric.

2. The method of claim 1 wherein the transferring comprises an etching of the dielectric.

3. The method of claim 1 wherein the photoresist is patterned photolithographically.

4. The method of claim 1, wherein the dielectric constant of the dielectric after the transferring is substantially the same as the dielectric constant prior to the transferring.

5. The method of claim 1 wherein the overlayer comprises a member selected from the group consisting of $(CH_2)n$, $(Ch_xF_y)n$ and $(CF_2)n$, where n is a whole number greater or equal to 1.

6. The method of claim 1 wherein the deposited overlayer covers at least about ⅓ of the length of the sidewalls.

7. The method of claim 6 wherein the deposited overlayer covers at most about ⅔ of the length of the sidewalls.

8. The method of claim 6 wherein substantially none of the overlayer is deposited on the bottom of the void.

9. The method of claim 1 wherein the pattern transferred to the dielectric is substantially similar in depth and width to the voids patterned in the photoresist.

10. The method of claim 6 wherein the pattern transferred to the dielectric is substantially similar in depth and width to the voids patterned in the photoresist.

11. The method of claim 1 wherein the overlayer is at least about 10 nm and at most about 100 nm thick.

12. The method of claim 1 wherein steps c and d take place in the same etch chamber.

13. A method for maintaining profile control during the etching of dielectrics, comprising:

depositing a layer of photoresist over a layer of dielectric;

b) patterning the photoresist such that voids are formed in the photoresist, the voids having sidewalls and a bottom, the voids having a depth and width;

c) depositing an overlayer in an etch chamber;

d) transferring the patterning in the photoresist to the dielectric, wherein the pattern transferred to the dielectric is substantially similar in depth and width to the depth and width of the voids patterned in the photoresist.

14. The method of claim 13 wherein the deposition of the overlayer is non-oxidizing and capable of depleting the etch chamber of chemically active species.

15. The method of claim 1 wherein the overlayer reduces sidewall roughness, bowing and undercuts.

16. The method of claim 14 wherein the overlayer reduces sidewall roughness, bowing and undercuts.

* * * * *